(12) United States Patent
Miyakawa et al.

(10) Patent No.: US 7,257,011 B2
(45) Date of Patent: Aug. 14, 2007

(54) SEMICONDUCTOR MEMORY HAVING TWISTED BIT LINE ARCHITECTURE

(75) Inventors: Tadashi Miyakawa, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/258,922

(22) Filed: Oct. 27, 2005

(65) Prior Publication Data

US 2006/0092748 A1     May 4, 2006

(30) Foreign Application Priority Data

Oct. 29, 2004    (JP)  ............................. 2004-316283

(51) Int. Cl.
*G11C 5/08* (2006.01)
*G11C 5/06* (2006.01)
(52) U.S. Cl. ........................... 365/69; 365/63; 365/214
(58) Field of Classification Search ................... 365/69
See application file for complete search history.

(56) References Cited

U.S. PATENT DOCUMENTS

| | | | | | |
|---|---|---|---|---|---|
| 5,014,110 | A | * | 5/1991 | Satoh | 257/776 |
| 5,280,443 | A | * | 1/1994 | Hidaka et al. | 365/63 |
| 5,602,772 | A | * | 2/1997 | Nakano et al. | 365/51 |
| 6,069,815 | A | * | 5/2000 | Mueller et al. | 365/63 |
| 6,084,307 | A | * | 7/2000 | Keeth | 257/776 |
| 6,345,010 | B1 | * | 2/2002 | Shimazaki et al. | 365/230.03 |
| 6,363,003 | B1 | * | 3/2002 | Miyamoto | 365/145 |
| 6,522,565 | B2 | * | 2/2003 | Shimazaki et al. | 365/63 |
| 6,665,204 | B2 | * | 12/2003 | Takeda | 365/63 |
| 6,795,331 | B2 | * | 9/2004 | Noro | 365/145 |
| 6,841,819 | B2 | * | 1/2005 | Saito et al. | 257/295 |
| 6,898,102 | B2 | * | 5/2005 | Keeth | 365/63 |
| 6,947,324 | B1 | * | 9/2005 | Lee et al. | 365/185.05 |

OTHER PUBLICATIONS

Tsutomu Yoshihara, et al., "A Twisted Bit Line Technique for Multi-Mb DRAMs", IEEE International Solid-State Circuits Conference, Session XVI: Dynamic Memory, Feb. 19, 1988, pp. 238-239.

Hideto Hidaka, et al., "Twisted Bit-Line Architectures for Multi-Megabit DRAM's", IEEE Journal of Solid-State Circuits, vol. 24, No. 1, Feb. 1989, pp. 21-27.

* cited by examiner

*Primary Examiner*—Son L. Mai
(74) *Attorney, Agent, or Firm*—Oblon, Spivak, McClelland, Maier & Neustadt, P.C.

(57) ABSTRACT

A semiconductor memory according to an example of the present invention comprises first and second bit lines having a twisted bit-line architecture in which the first and second bit lines are alternately twisted at a constant period in first and second columns, a first cell block which is disposed in the first column, a first block select transistor which is connected between the first or second bit line and one end of the first cell block, a second cell block which is disposed in the second column, and a second block select transistor which is connected between the second or first bit line and one end of the second cell block.

20 Claims, 12 Drawing Sheets

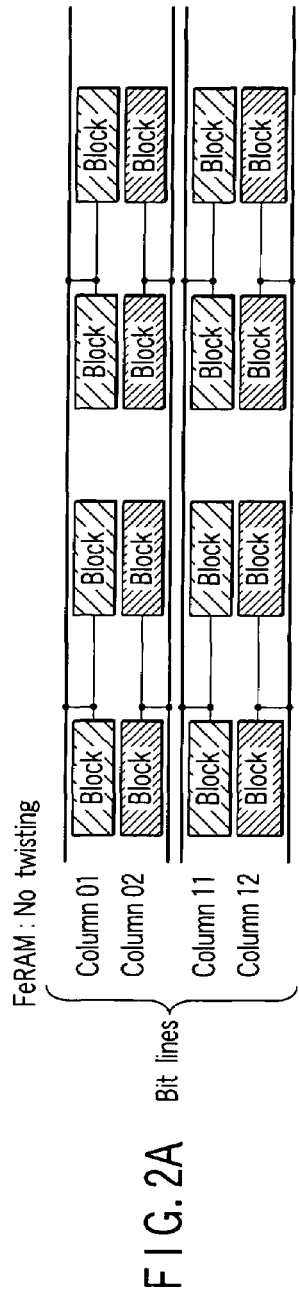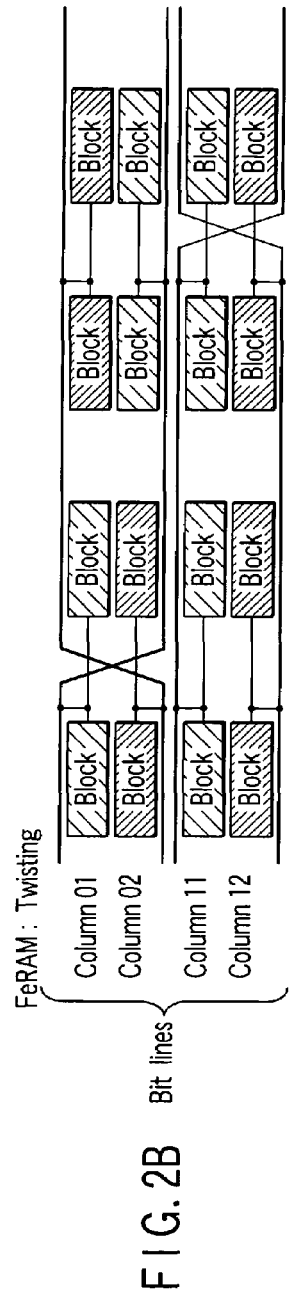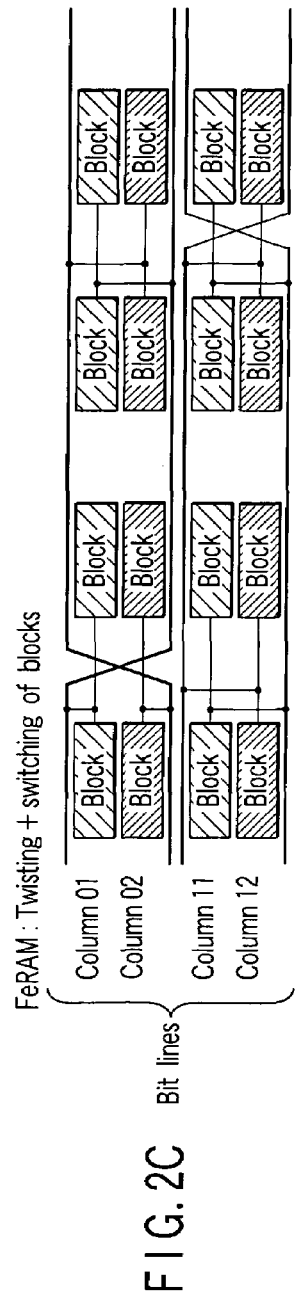

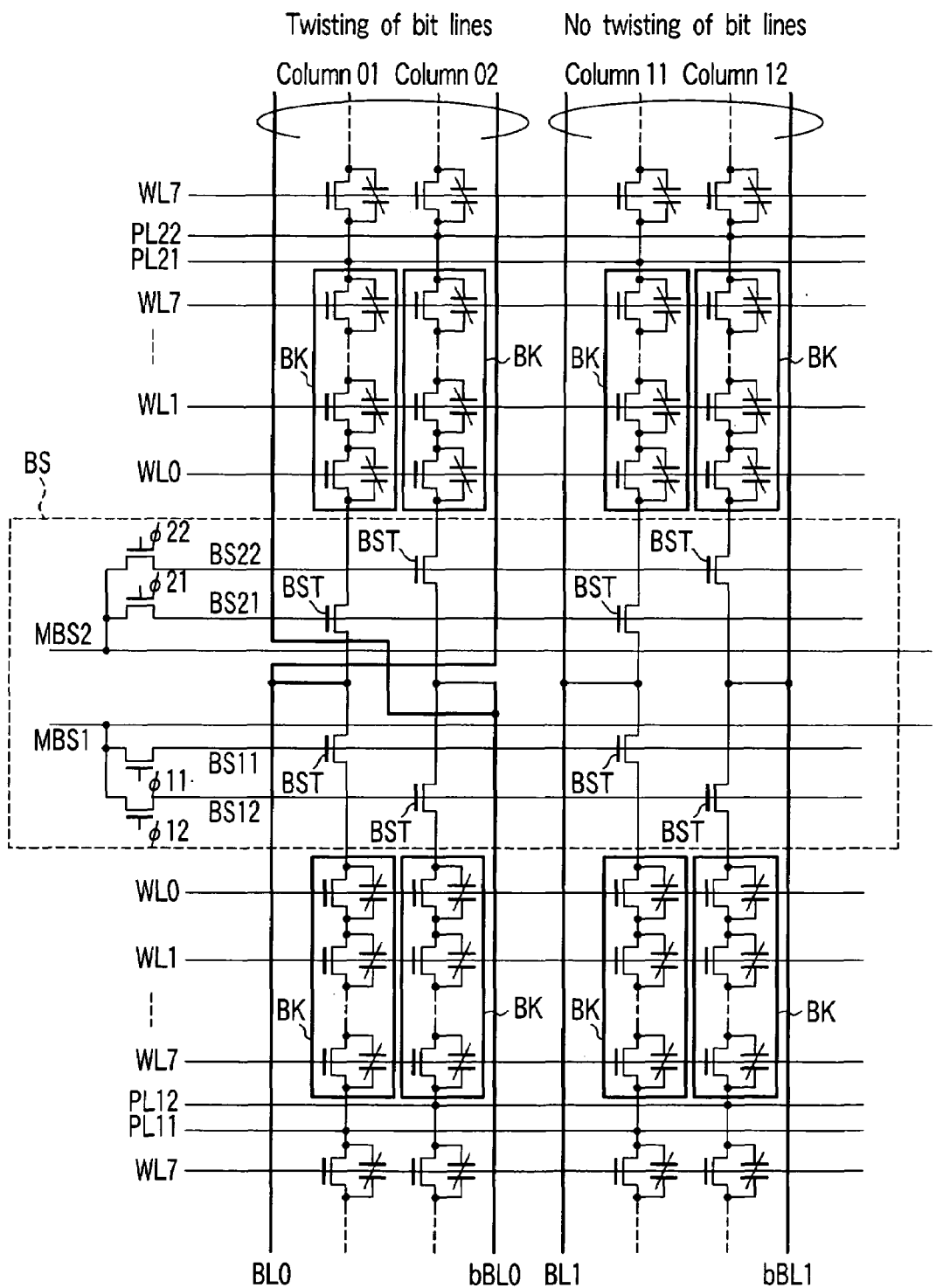
F I G. 3

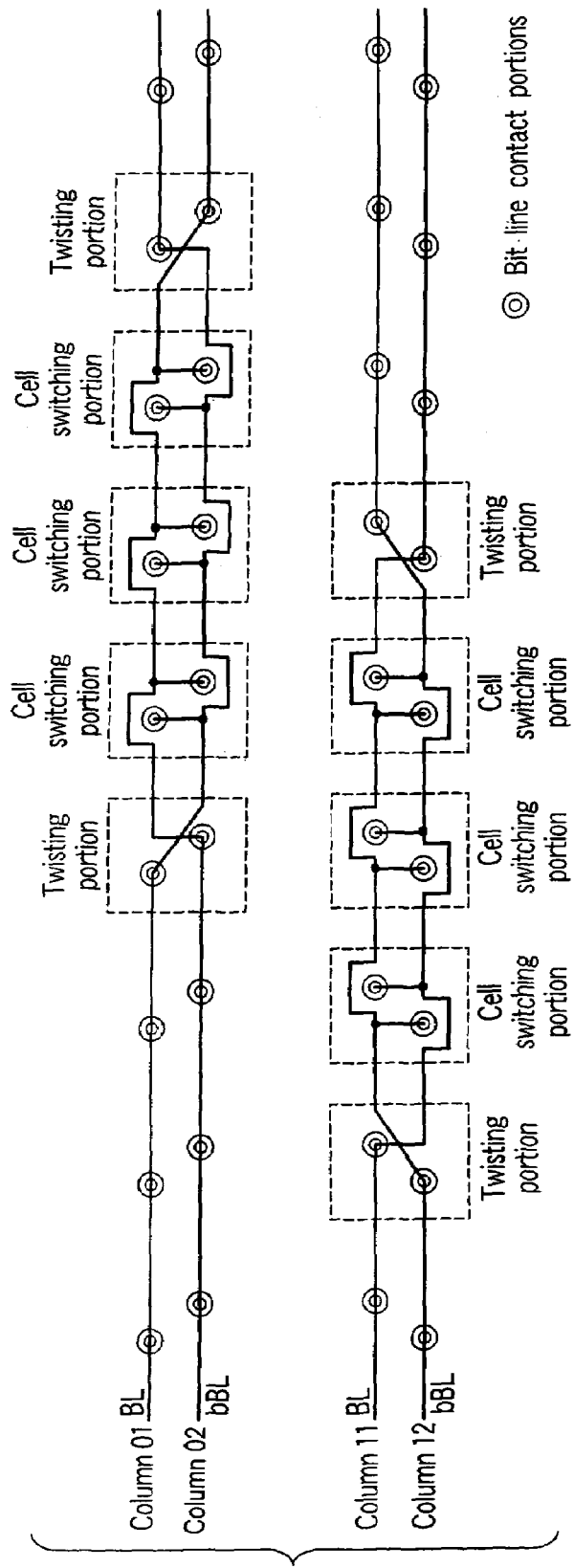
F I G. 9

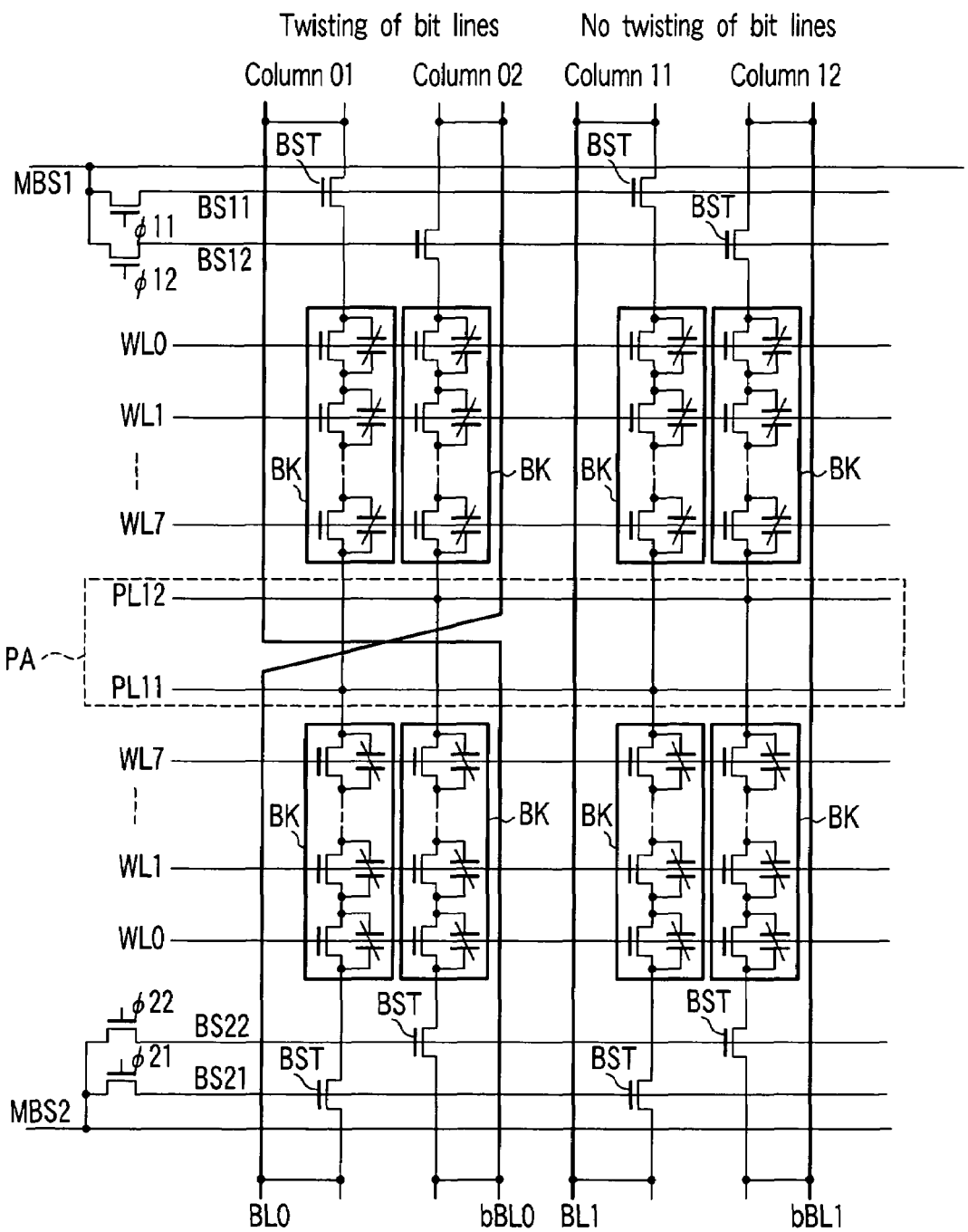
F I G. 15

SEMICONDUCTOR MEMORY HAVING TWISTED BIT LINE ARCHITECTURE

CROSS-REFERENCE TO RELATED APPLICATIONS

This application is based upon and claims the benefit of priority from prior Japanese Patent Application No. 2004-316283, filed Oct. 29, 2004, the entire contents of which are incorporated herein by reference.

BACKGROUND OF THE INVENTION

1. Field of the Invention

The present invention relates to a twisted bit-line architecture of a semiconductor memory having block select transistors, and is used for, in particular, a T (transistor) C (capacitor) unit type ferroelectric RAM (FeRAM).

2. Description of the Related Art

In a memory product having a memory cell array composed of a plurality of memory cells disposed in a matrix form, wiring intervals such as intervals of bit-lines or intervals of word lines have been being made extremely narrower in accordance with the miniaturization of memory cells.

As a result, in particular, in a memory for reading a minute signal from a memory cell such as a dynamic random access memory (DRAM) or a ferroelectric memory (FeRAM) to a bit-line, there is a significant effect on the minute signal under interference (noise) among bit-lines, which causes a malfunction.

Then, in order to absorb interference between adjacent bit-lines, a twisted bit-line architecture in which these bit-lines are elongated in one direction while being twisted is used in such a memory product (for example, refer to H. Hidaka et al, "Twisted bit-line architectures for Multi-Megabit DRAM's" IEEE J. Solid-State Circuits, vol. 24, No 1, pp. 21-27, February 1989).

In a case of using a twisted bit-line architecture, however, it is necessary to newly provide regions for twisting adjacent bit-lines in a memory cell array.

Therefore, by taking a dynamic random access memory as an example, a region A for twisting directly results in an increase of an area of a memory cell array as shown in FIG. 18.

Accordingly, also in a case of using a twisted bit-line architecture in a semiconductor memory having block select transistors, i.e., in a TC unit type FeRAM, it is necessary to solve the problem of an increase of a memory cell array.

BRIEF SUMMARY OF THE INVENTION

A semiconductor memory according to an aspect of the present invention comprises: first and second bit lines having a twisted bit-line architecture in which the first and second bit lines are alternately twisted at a constant period in first and second columns; a first cell block which is disposed in the first column; a first block select transistor which is connected between the first or second bit line and one end of the first cell block; a second cell block which is disposed in the second column; and a second block select transistor which is connected between the second or first bit line and one end of the second cell block, wherein the twisting of the first and second bit lines is carried out at a block selector region in which the first and second block select transistors are disposed.

A semiconductor memory according to another aspect of the present invention comprises: first and second bit lines having a twisted bit-line architecture in which the first and second bit lines are alternately twisted at a constant period in first and second columns; a first cell block which is disposed in the first column; a first block select transistor which is connected between the first or second bit line and one end of the first cell block; a first plate line which is connected to the other end of the first cell block; a second cell block which is disposed in the second column; a second block select transistor which is connected between the second or first bit line and one end of the second cell block; and a second plate line which is connected to the other end of the second cell block, wherein the twisting of the first and second bit lines is carried out at a plate line region in which the first and second plate lines are disposed.

A semiconductor memory according to still another aspect of the present invention comprises: first and second bit lines having a twisted bit-line architecture in which the first and second bit lines are alternately twisted at a constant period in first and second columns; a plurality of first memory cells which are disposed in the first column; and a plurality of second memory cells which are disposed in the second column, wherein the first bit line is always connected to said plurality of first memory cells, and the second bit line is always connected to said plurality of second memory cells.

BRIEF DESCRIPTION OF THE SEVERAL VIEWS OF THE DRAWING

FIGS. 2A to 2C are diagrams showing a concept of a twisted bit-line architecture according to an example of the invention;

FIG. 3 is a diagram showing a memory cell array portion of a ferroelectric memory according to an example of the invention;

FIG. 9 is a diagram showing the twisted bit-line architecture according to the third embodiment;

FIG. 15 is a diagram showing a memory cell array portion of a ferroelectric memory according to an example of the invention;

DETAILED DESCRIPTION OF THE INVENTION

A semiconductor memory of an aspect of the present invention will be described below in detail with reference to the accompanying drawings.

1. Outline

An example of the invention proposes a layout of bit lines for which a twisted bit-line architecture can be used without an increase of an area of a memory cell array in a semiconductor memory having block select transistors.

Therefore, in the example of the invention, twisting of adjacent bit lines is carried out at a block selector region in which the block select transistors are disposed.

For example, in a TC unit type FeRAM, a cell block is composed of a plurality of TC units connected in series, and bit lines are connected to one end of the cell block via the block select transistors. Further, a TC unit is composed of a MOS transistor and a cell capacitor (ferroelectric capacitor) connected in parallel.

When twisting of adjacent bit lines is carried out at a block selector region in this case, there is no need to provide a new region for twisting, and there is no case of increasing an area of the memory cell array even if a twisted bit-line architecture is used.

Figure 1:
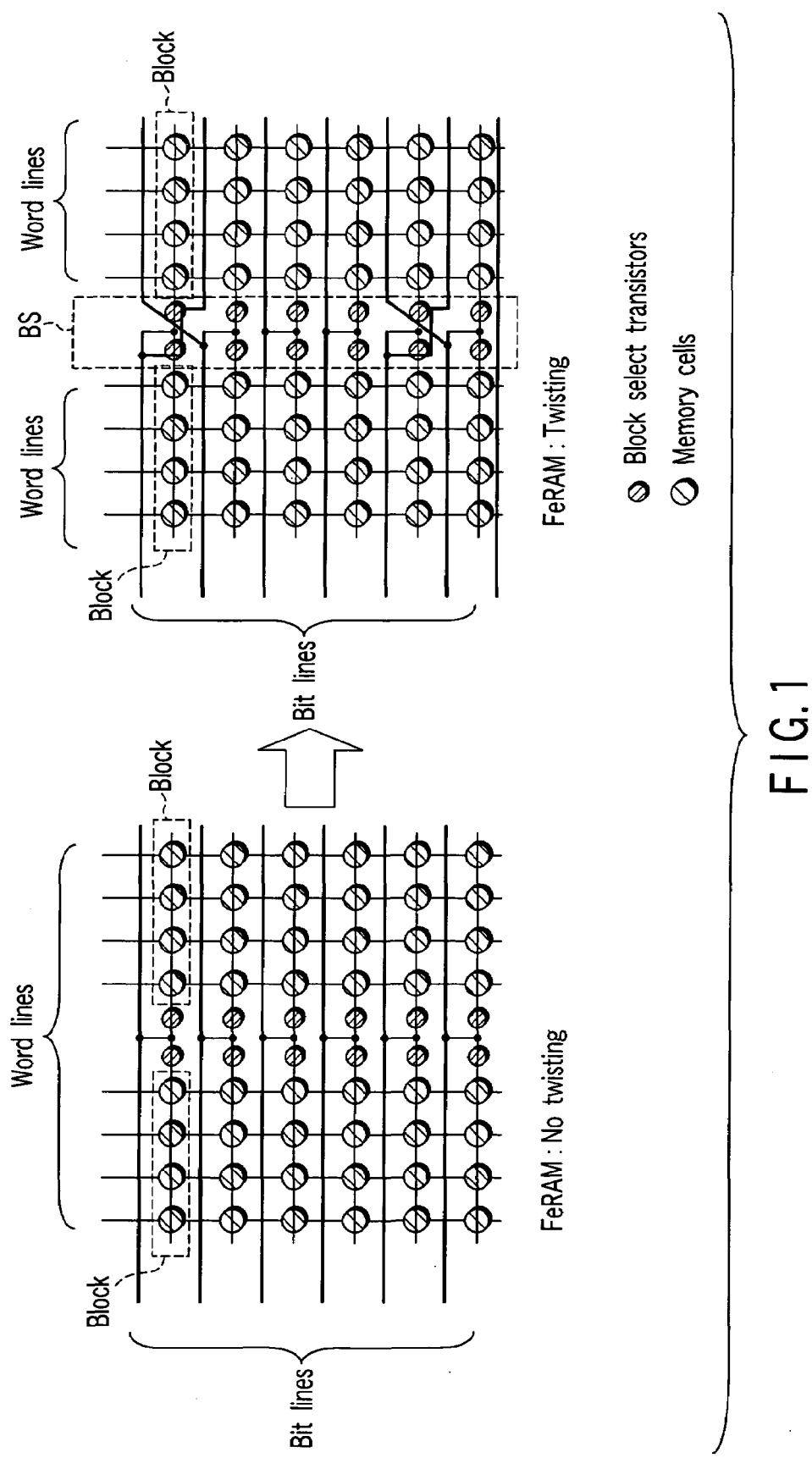
FIG. 1 is a diagram showing a concept of a twisted bit-line architecture according to an example of the invention.

FIG. 1 shows a concept of a twisted bit-line architecture according to the example of the invention.

Larger circles show TC units configuring cell blocks, and smaller circles show block select transistors. One end of a cell block including four TC units is connected to a bit-line via a block select transistor. Here, wiring layers such as word lines or bit lines are compactly disposed in a region on the TC units, and in contrast thereto, wiring layers such as block select lines or bit lines are not compactly disposed in a region on the block select transistors as compared with the region on the TC units.

In the example of the invention, twisting of bit lines is realized by utilizing a block selector region BS at which block select transistors are arrange.

Note that, in a ferroelectric memory having block select transistors, for example, when a block selector region is disposed at one end of a cell block, a plate line region is disposed at the other end of the cell block.

The plate line region is a region for disposing plate lines which supply a plate electric potential to the other end of the cell block.

Accordingly, even if twisting of adjacent bit lines is carried out at the plate line region, there is no need to provide a new region for twisting. Thus, there is no case in which an area of the memory cell array is increased even if a twisted bit-line architecture is used.

FIG. 2 shows a concept of a twisted bit-line architecture according to another example of the invention.

This example can be, as a matter of course, applied to a semiconductor memory having block select transistors, but not limited thereto, and can be broadly applied to all semiconductor memories using a twisted bit-line architecture.

FIG. 2A is, for example, a layout of bit lines of a ferroelectric memory for which a twisted bit-line architecture is not used.

FIG. 2B is, for example, a layout of bit lines of a ferroelectric memory for which a twisted bit-line architecture is used. Twisting of bit lines is carried out at a constant period at a block selector region so as to be equally divided in order for a pair of bit lines to be equally affected by the adjacent bit lines.

In FIG. 2B, the relationship between twisting of bit lines and cell blocks connected to the bit lines. Cell blocks on the same column alternately switch the bit lines to be connected thereto by twisting.

A layout in FIG. 2C shows a concept of a twisted bit-line architecture according to yet another example of the invention, and is characterized in that switching of cell blocks (or memory cells) is carried out as needed simultaneously with twisting of bit lines.

Even if twisting of bit lines is carried out by the switching of cell blocks, cell blocks connected to the same bit line always exist in the same column. In this case, the physical locations of the cell blocks connected to the same bit can be made completely the same as those in a case in which twisting of bit lines is not carried out.

In the present example, only interference between bit lines can be reduced by changing only wiring layers, but without a change in a characteristic due to a layout of cell blocks (or memory cells). It can be achieved without associated a change of physical addresses, and without a change of evaluation circumstances.

Accordingly, a semiconductor memory having a more stable characteristic can be proposed.

2. EMBODIMENTS

Next, several embodiments to be the best will be described.

(1) First Embodiment

In a first embodiment, a twisted bit-line architecture according to the example of the invention will be described by using a TC unit type FeRAM as an example.

A. Circuit Configuration

FIG. 3 shows a circuit diagram of the TC unit type FeRAM according to the first embodiment of the invention.

A plurality of cell blocks BK configure a memory cell array so as to be disposed in a matrix form. A cell block BK is composed of cell units connected in series. A cell unit is composed of a MOS transistor and a ferroelectric capacitor connected in parallel.

In the embodiment, there are 8 cell units. Word lines WL0, WL1, ... WL7 are disposed so as to correspond to the 8 cell units.

One ends of the cell blocks are connected to bit lines BL0, bBL0, BL1, and bBL1 via block select transistors BST. Block select lines BS11, BS12, BS21, and BS22 are connected to control terminals (gates) of the block select transistors BST.

The block select lines BS11, BS12, BS21, and BS22 are connected to main block select lines MBS1 and MBS2 via transfer transistors which are controlled so as to be turned on/off by control signals $\phi 11$, $\phi 12$, $\phi 21$, and $\phi 22$.

Further, the other ends of the cell blocks are connected to plate lines PL11, PL12, PL21, and PL22.

Here, in the present embodiment, a pair of two bit lines BL0 and bBL0 have a twisted bit-line architecture in which they are alternately switched in columns 01 and 02. Then, switching (twisting) of the bit lines BL0 and bBL0 which is the feature of the example of the invention is carried out at a block selector region in which the bock select transistors BST are disposed.

Note that, in the present embodiment, a cell array structure in which two cell blocks BK in a same column (for example, the column 01) have one bit line contact portion together is used.

In this case, a bit line contact portion and block select transistors BST are disposed at one end side of a cell block BK, and a plate line contact portion and plate lines are disposed at the other end side thereof.

Accordingly, switching (twisting) of the bit lines BL0 and bBL0 may be carried out at a plate line region at the other end side of a cell block BK, or at the both of a block selector region and the plate line region.

B. Layout of Twisted Bit-Line Architecture

Figure 4:
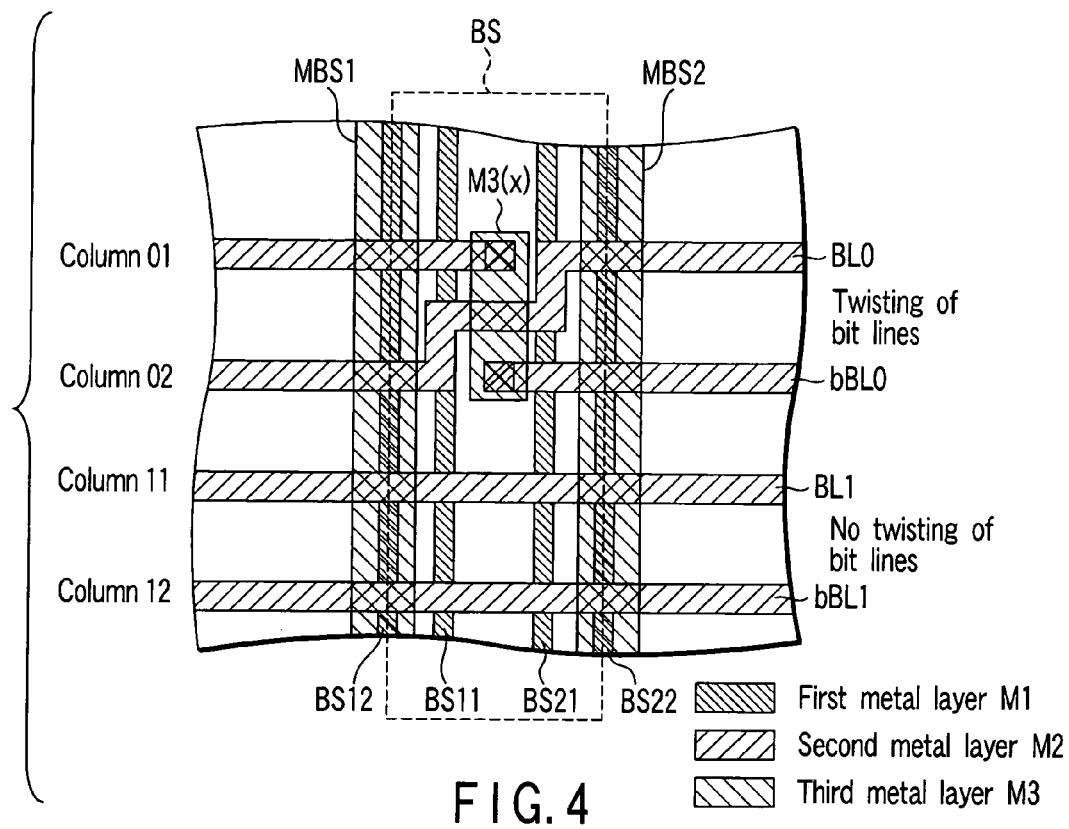
FIG. 4 is a diagram showing a twisted bit-line architecture according to a first embodiment.

FIG. 4 shows a layout of a twisted bit-line architecture according to the embodiment of the invention. Note that, in FIG. 4, components which are the same as those in FIG. 3 are denoted by the same reference numerals.

In the present embodiment, presupposing that twisting of bit lines is carried out at a block selector region BS, here, a layout of block selector regions BS is shown.

The block select lines BS11, BS12, BS21, and BS22 are disposed in a first metal layer (wiring layer) M1. The block select lines BS11, BS12, BS21, and BS22 extend in the same direction, and are connected to the block select transistors.

The bit lines BL0, bBL0, BL1, and bBL1 are disposed in a second metal layer M2 on the first metal layer M1. The bit lines BL0, bBL0, BL1, and bBL1 have a twisted bit-line architecture, and extend in the same direction.

For example, the bit line bBL0 is moved from the column 02 to the column 01 at the block selector region BS in the second metal layer M2. Further, the bit line BL0 is moved from the column 01 to the column 02 via a wiring M3(x) in a third metal layer M3 on the second metal layer M2 at the block selector region BS.

The main block select lines MBS1 and MBS2 are disposed in the third metal layer M3. The main block select lines MBS1 and MBS2 extend in the same direction, and are connected to the block select lines BS11, BS12, BS21, and BS22 in the first metal layer M1 via the transfer transistors in FIG. 3.

Further, the main block select lines MBS1 and MBS2 are disposed so as to have sufficient intervals with respect to the wiring M3(x) for use in twisting.

In accordance with such a layout, switching (twisting) of bit lines is carried out at a block selector regions BS. Thus, layouts of the cell units, the cell blocks, the block select transistors, and the like in cases in which there is twisting of bit lines and there is no twisting of bit lines are no different from each other.

C. Summary

As described above, in accordance with the first embodiment, there is no increase of an area of a memory cell array even if a twisted bit-line architecture is used. Consequently, it is possible to realize a twisted bit-line architecture, which can reduce the effect of noise from an adjacent bit line onto a minute signal of a bit line, and an attempt can be made to stabilize the operations.

With respect to the stability of a minute signal of a bit line, interference between bit lines can be reduced to about ½ by using a twisted bit-line architecture.

(2) Second Embodiment

A second embodiment is a modified example of the first embodiment.

A. Circuit Configuration

Because a circuit configuration according to the second embodiment is completely the same as that according to the first embodiment (FIG. 3), description thereof will be omitted here.

B. Layout of Twisted Bit-Line Architecture

Figure 5:
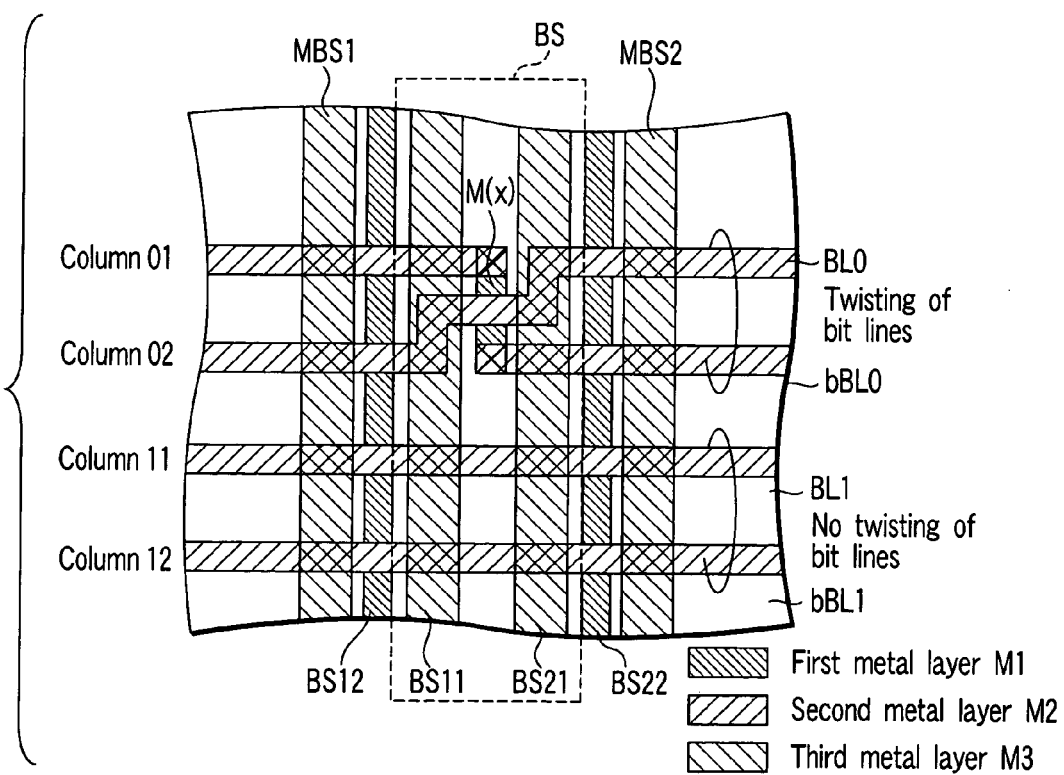
FIG. 5 is a diagram showing a twisted bit-line architecture according to a second embodiment.

FIG. 5 shows a layout of a twisted bit-line architecture according to the embodiment of the invention. Note that, in FIG. 5, same components as those in FIG. 3 are denoted by the same reference numerals.

In the first embodiment, twisting of bit lines at the block selector region BS is carried out by using wirings in the second and third metal layers M2 and M3. Then, in the second embodiment, an example in which twisting of bit lines at the block selector region BS is carried out by using wirings in the first and second metal layers M1 and M2 will be omitted.

The block select lines BS12 and BS22 are disposed in the first metal layer (wiring layer) M1. The block select lines BS12 and BS22 extend in the same direction, and are connected to the block select transistors.

The bit lines BL0, bBL0, BL1, and bBL1 are disposed in the second metal layer M2 on the first metal layer M1. The bit lines BL0, bBL0, BL1, and bBL1 have a twisted bit-line architecture, and extend in the same direction.

For example, the bit line bBL0 is moved from the column 02 to the column 01 at the block selector region BS in the second metal layer M2. Further, the bit line BL0 is moved from the column 01 to the column 02 via the wiring M3(x) in the first metal layer M1 at the block selector region BS.

The block select lines BS11 and BS21, and the main block select lines MBS1 and MBS2 are disposed in the third metal layer M3 on the second metal layer M2. The main block select lines MBS1 and MBS2 are connected to the block select lines BS11 and BS21 via the transfer transistors in FIG. 3, and are connected to the block select lines BS12 and BS22 in the first metal layer M1.

In the present embodiment, the block select lines BS12 and BS22 are disposed in the first metal layer M1, and the block select lines BS11 and BS21 are disposed in the third metal layer M3. In this way, block select lines BS11, BS12, BS21, and BS22 may be divided into two wiring layers.

Further, the block select lines BS12 and BS22 are disposed so as to have sufficient intervals with respect to the wiring M3(x) for use in twisting.

In such a layout as well, switching (twisting) of bit lines is carried out at a block selector region BS. Thus, layouts of the cell units, the cell blocks, the block select transistors, and the like in cases in which there is twisting of bit lines and there is no twisting of bit lines are no different from each other.

C. Summary

As described above, also in accordance with the second embodiment, in the same way as the first embodiment, the effect can be obtained that it is possible to realize a twisted bit-line architecture without an increase of an area of a memory cell array, an effect of noise from an adjacent bit line to a minute signal of a bit line can be reduced, and an attempt can be made to stabilize the operation.

(3) Third Embodiment

In a third embodiment, a layout is proposed in which such that cell blocks or cell memories disposed in the same column are always connected to the same bit line even if twisting of bit lines is carried out in a semiconductor memory using a twisted bit-line architecture.

A. Layout of Twisted Bit-Line Architecture

Figure 6:
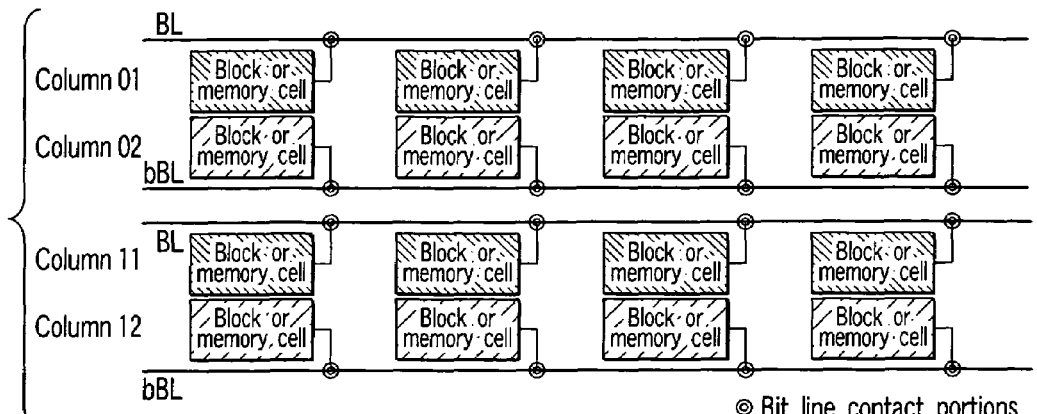
FIG. 6 is a diagram showing an outline of a semiconductor memory for which a twisted bit-line architecture is not used.
Figure 7:
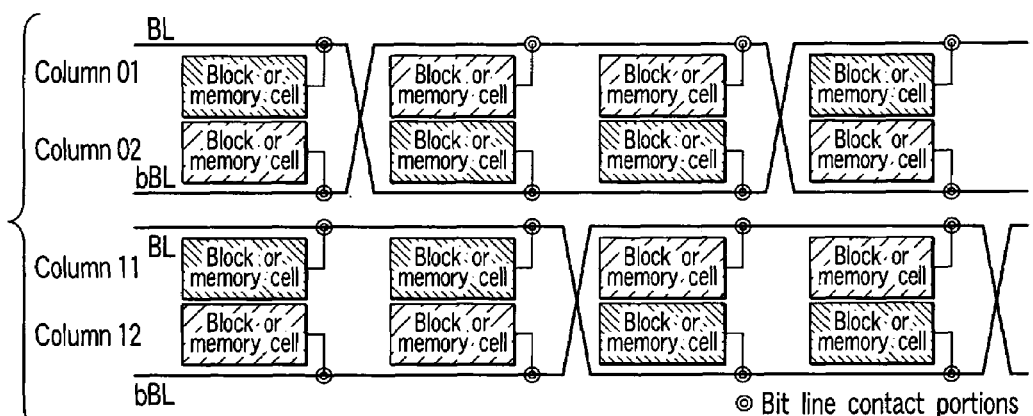
FIG. 7 is a diagram showing an outline of a semiconductor memory for which a twisted bit-line architecture is used.

FIG. 6 is an outline of a layout of bit lines of a semiconductor memory for which a twisted bit-line architecture is not used, and FIG. 7 is an outline of a layout of bit lines of a general semiconductor memory for which a twisted bit-line architecture is used.

Twisting of bit lines is, as shown in FIG. 7, carried out at a constant period, concretely, at a period of integer multiples of a cycle in which bit line contact portions are disposed in the same column.

Here, with respect to usual twisting, only the bit lines BL and bBL are alternately switched without a change of a layout of cell blocks or memory cells. Consequently, positions (columns) of the cell blocks or memory cells connected to the same bit line are switched every time twisting of the bit lines BL and bBL is carried out.

Figure 8:
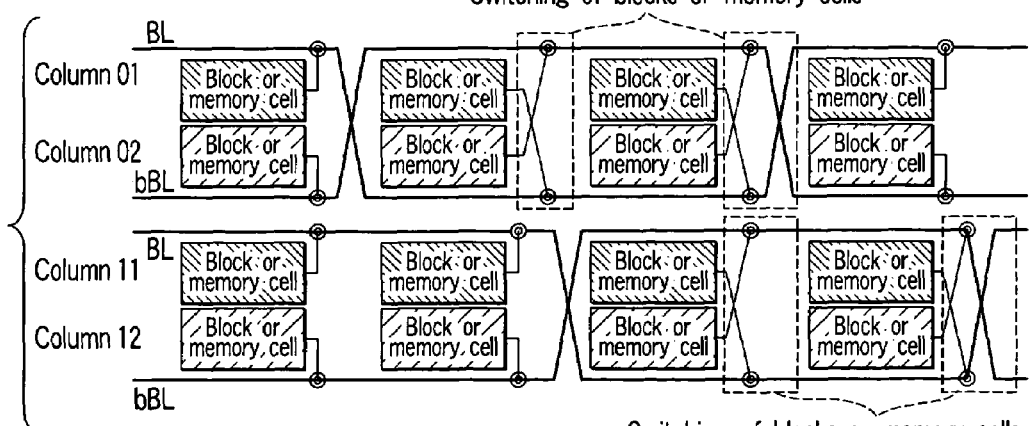
FIG. 8 is a diagram showing a twisted bit-line architecture according to a third embodiment.

FIG. 8 shows an outline of a layout of bit lines according to the third embodiment.

The layout in the embodiment is characterized in that switching of cell blocks or memory cells is carried out as needed in addition to twisting of the bit lines BL and bBL.

Even if twisting of the bit lines BL and bBL is carried out by switching of cell blocks or memory cells, cell blocks or memory cells in the same column can be connected to the same bit line.

In this case, the physical locations of the cell blocks or memory cells connected to the same bit can be made completely the same as those in a case shown in FIG. 6 in which twisting of bit lines is not carried out. In accordance with the present embodiment, switching of cell blocks or memory cells can be easily carried out by merely changing, for example, a layout of portions at which the bit lines BL and bBL and bit-line contacts (shown by ⊙) are connected to one another without a change of, for example, a layout of the cell blocks or the memory cells.

Accordingly, the effect on the memory characteristic which the layout of cell blocks (or memory cells) has can be made little, and a semiconductor memory having an always stable characteristic can be proposed.

Note that, as in the first and second embodiments, twisting of the bit lines BL and bBL may be carried out at block selector regions, or may be carried out at other regions.

FIG. 9 is a diagram in which only the bit lines and the bit line contact portions in the layout of FIG. 8 are taken out.

In the present embodiment, switching of the bit lines BL and bBL is carried out at a twisting portion. When the bit line BL is disposed in the column 02, and the bit line bBL is disposed in the column 01, switching of the blocks or memory cells is carried out at a cell switching portion. In the same way, when the bit line BL is disposed in the column 11, and the bit line bBL is disposed in the column 12, switching of the blocks or memory cells is carried out at a cell switching portion.

Figure 10:
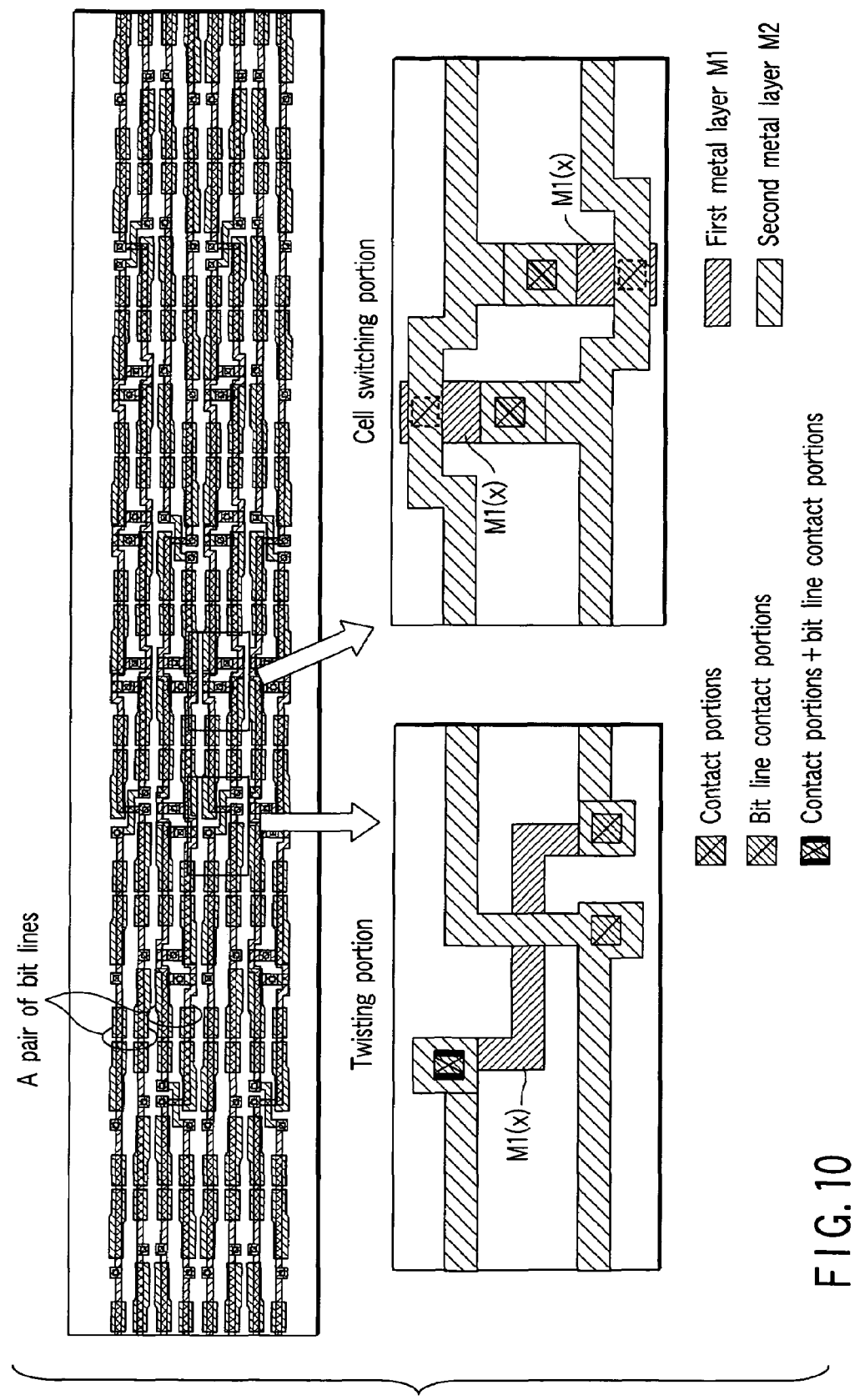
FIG. 10 is a diagram showing the twisted bit-line architecture according to the third embodiment.
Figure 11:
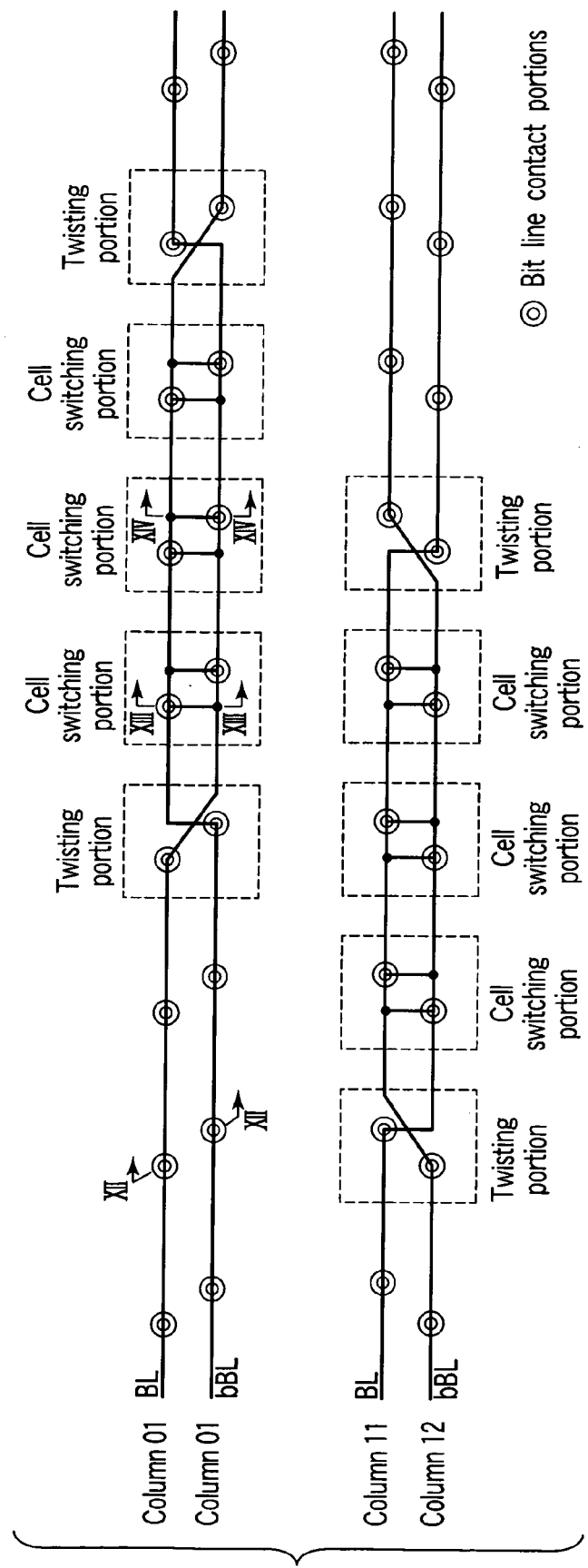
FIG. 11 is a diagram showing a structure of bit line contact portions according to the third embodiment.
Figure 12:
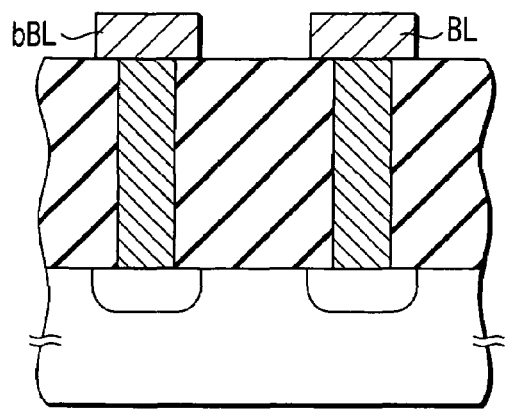
FIG. 12 is a diagram showing a structure of a bit line contact portion according to the third embodiment.
Figure 13:
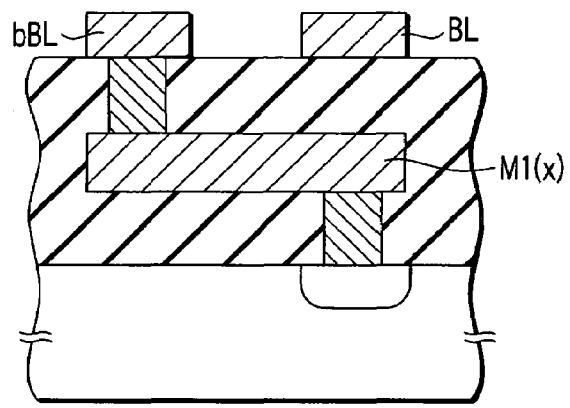
FIG. 13 is a diagram showing a structure of a bit line contact portion according to the third embodiment.
Figure 14:
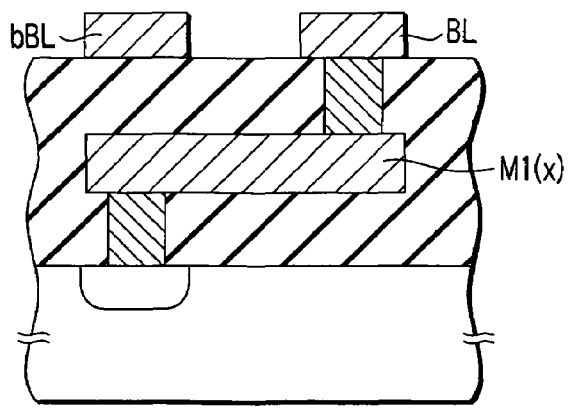
FIG. 14 is a diagram showing a structure of a bit line contact portion according to the third embodiment.

FIG. 10 shows a layout of the twisted bit-line architecture according to the third embodiment.

The bit lines BL and bBL are formed in the second metal layer M2 on the first metal layer (wiring layer) M1. Further, switching of the bit lines BL and bBL is carried out by using the wiring M1(x) in the first metal layer (wiring layer) M1 at a twisting portion. The twisting portion may be a block selector region, or other region.

In this case, switching of the cell blocks or memory cells is, for example, in the same way as switching of the bit lines BL and bBL, carried out by using the wiring M1(x) in the first metal layer (wiring layer) M1 at a cell switching portion.

Note that switching of the bit lines BL and bBL at a twisting portion may use the wiring M3(x) in the third metal layer M3 on the second metal layer M2.

B. Layout of Twisted Bit-Line Architecture

FIGS. 11 to 14 show structures at bit line contact portions (cell switching portions) in the twisted bit-line architecture according to the third embodiment.

The bit lines BL and bBL are always connected to cell blocks or memory cells in the same column by using wiring layer different from a wiring layer in which these bit lines BL and bBL are formed.

The bit lines BL and bBL are twisted at a constant period, concretely, at a period of integer multiples of a cycle in which bit line contact portions are disposed in the same column.

C. Summary

In accordance with such a layout, cell blocks or memory cells in the same column are always connected to the same bit line even if switching (twisting) of bit lines is carried out. Therefore, the effect on the memory characteristic which the layout of the cell blocks or memory cells has can be made little, and a semiconductor memory having an always stable characteristic can be realized.

Note that the twisted bit-line architecture in the third embodiment is not limited to a semiconductor memory having block select transistors, and can be broadly applied to all semiconductor memories for which a twisted bit-line architecture is used.

Further, the third embodiment can be realized by combining the first and second embodiments described above.

(4) Fourth Embodiment

In a fourth embodiment, an example in which twisting of bit lines is carried out at a plate line region in which plate lines are disposed in a ferroelectric memory.

A. Circuit Configuration

FIG. 15 shows a circuit diagram of a TC unit type FeRAM according to the fourth embodiment of the invention.

A plurality of cell blocks BK configure a memory cell array so as to be disposed in a matrix form. A cell block BK is composed of a plurality of cell units connected in series. A cell unit is composed of a MOS transistor and a ferroelectric capacitor connected in parallel.

In the present embodiment, there are 8 cell units. Word lines WL0, WL1, . . . WL7 are disposed so as to correspond to the 8 cell units.

One ends of the cell blocks are connected to the bit lines BL0, bBL0 ,BL1, and bBL1 via the block select transistors BST. The block select lines BS11, BS12, BS21, and BS22 are connected to control terminals (gates) of the block select transistors BST.

The block select lines BS11, BS12, BS21, and BS22 are connected to the main block select lines MBS1 and MBS2 via transfer transistors which are controlled so as to be turned on/off by the control signals φ11, φ12, φ21, and φ22.

Further, the other ends of the cell blocks are connected to the plate lines PL11, PL12, PL21, and PL22.

Here, in the present embodiment, the two bit lines BL0 and bBL0 which are adjacent to each other have a twisted bit-line architecture in which they are alternately switched in the columns 01 and 02 at a constant period. Then, switching (twisting) of the bit lines BL0 and bBL0 which is the feature of the embodiment of the invention is carried out at plate line regions PA at which the plate lines PL11, PL12, PL21, and PL22 are disposed.

Note that, the constant period is equal to a period of integer multiples of a cycle in which plate line contact portions are disposed in the columns 01 and 02.

B. Layout of Twisted Bit-Line Architecture

Figure 17:
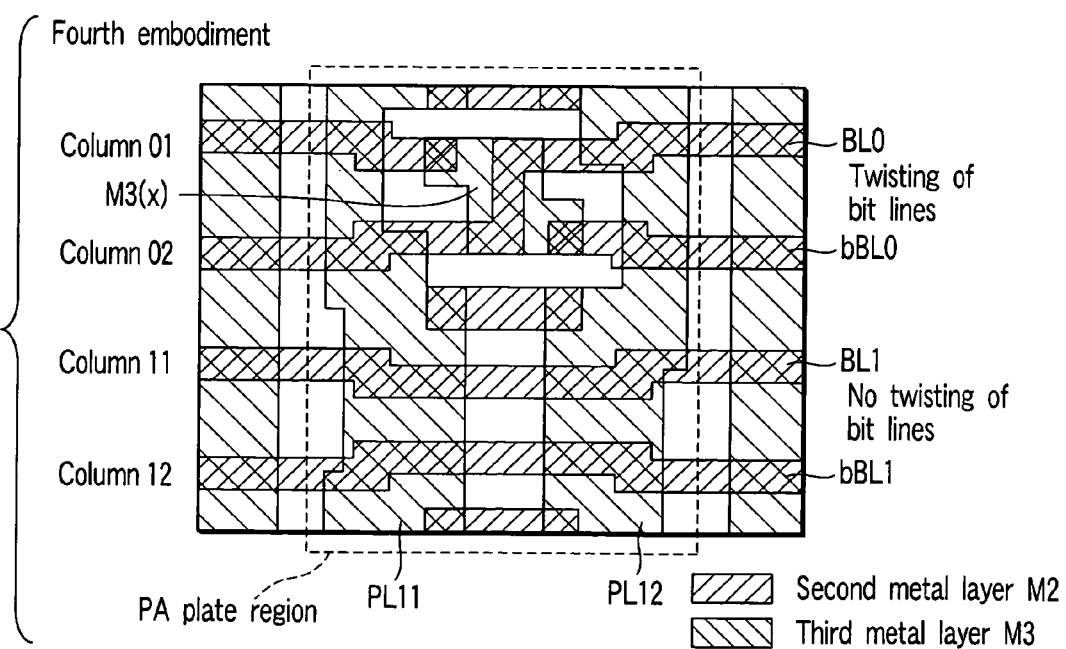
FIG. 17 is a diagram showing the twisted bit-line architecture according to the fourth embodiment.
Figure 18:
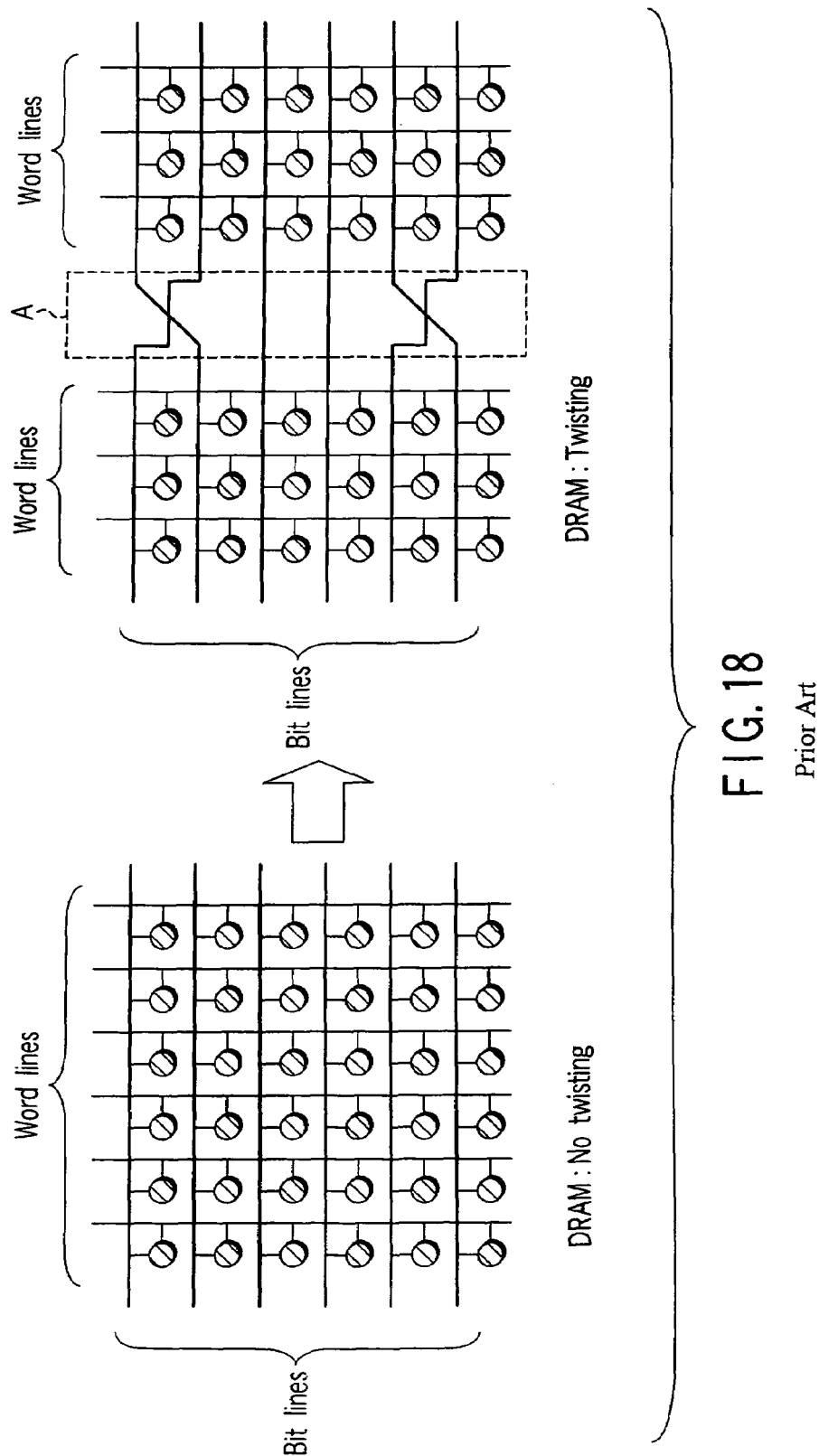
FIG. 18 is a diagram showing a concept of a twisted bit-line architecture as premise for an example of the invention.

FIG. 17 shows a layout of a twisted bit-line architecture according to the fourth embodiment of the invention.

Note that, in FIG. 17, same components as those in FIG. 15 are denoted by the same reference numerals.

In the present embodiment, presupposing that twisting of bit lines is carried out at a plate line region PA, a layout of the plate line regions PA is shown here. The bit lines BL0, bBL0, BL1, and bBL1 are disposed in the second metal layer M2 on first metal layer M1. The bit lines BL0, bBL0, BL1, and bBL1 have a twisted bit-line architecture, and extend in the same direction.

For example, the bit line BL0 is moved from the column 02 to the column 01 in the plate line region PA in the second metal layer M2. Further, the bit line bBL0 is moved from the column 01 to the column 02 via the wiring M3(x) in the third metal layer M3 on the second metal layer M2 at the plate line region PA.

The plate lines PL11 and PL12 are disposed in the third metal layer M3. The plate lines PL11 and PL12 extend in the same direction, and supply a plate electric potential to the other end of the cell block. Further, the plate lines PL11 and PL12 are disposed so as to have sufficient intervals with respect to the wiring M3(x) for use in twisting.

Figure 16:
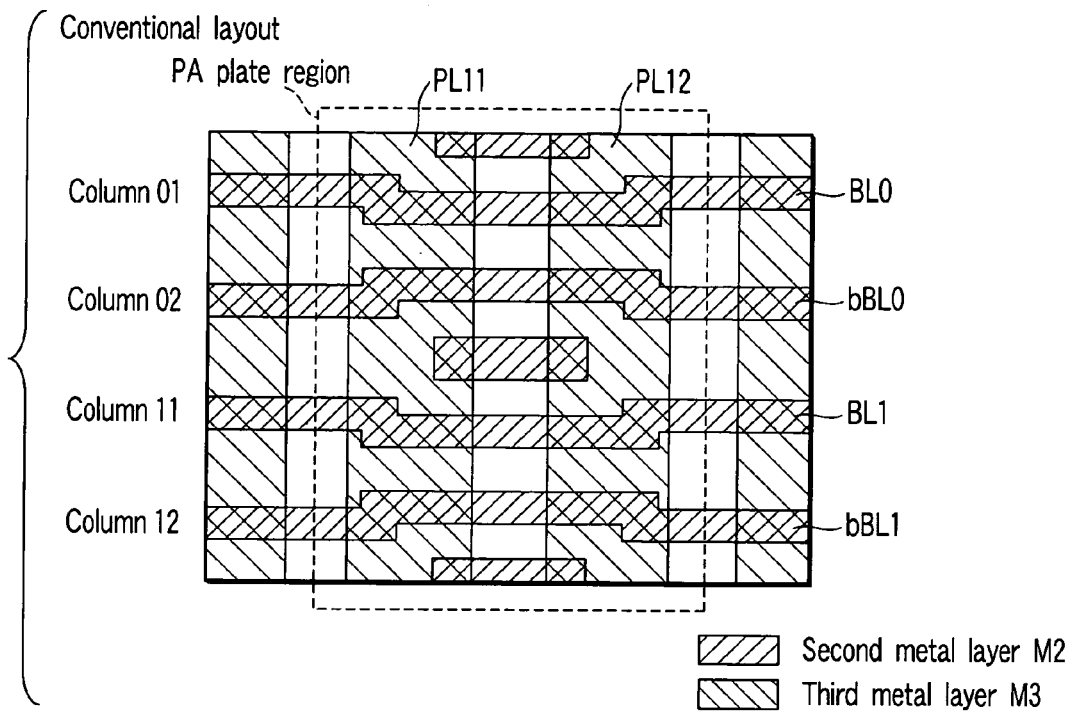
FIG. 16 is a diagram showing a twisted bit-line architecture according to a fourth embodiment.

In accordance with such a layout, switching (twisting) of bit lines is carried out at the plate line region PA. Thus, layouts of the cell units, the cell blocks, the block select transistors, and the like in cases in which there is no twisting of bit lines (FIG. 16) and there is twisting of bit lines (FIG. 17) are not different from each other.

C. Summary

As described above, in accordance with the fourth embodiment, there is no increase of an area of a memory cell array even if a twisted bit-line architecture is used. Therefore, it is possible to realize a twisted bit-line architecture, and an attempt can be made to stabilize a minute signal of a bit line.

With respect to the stability of a minute signal of a bit line, interference between bit lines can be reduced to about ½ by using a twisted bit-line architecture.

(5) Other

As described above, in a memory product in which the miniaturization in elements has progressed, it is effective that a twisted bit-line architecture is used in order to prevent a malfunction due to interference between bit lines. However, there has been the problem that an area of a memory cell array is increased thereby.

In accordance with the embodiments of the invention, twisting of bit lines is carried out at a block selector region or a plate line region in a semiconductor memory having block selector transistors, in particular, in a TC unit type FeRAM, which can realize a twisted bit-line architecture without an increase of an area of a memory cell array.

Further, in a semiconductor memory having a twisted bit-line architecture, a layout is used such that cell blocks or memory cells in the same column are always connected to the same bit line even if twisting of bit lines is carried out, whereby it is possible to realize a semiconductor memory having an always stable characteristic.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:
   first and second bit lines having a twisted bit-line architecture in which the first and second bit lines are alternately twisted at a constant period in first and second columns;
   a first cell block which is disposed in the first column;
   a first block select transistor which is connected between the first or second bit line and one end of the first cell block;
   a second cell block which is disposed in the second column; and
   a second block select transistor which is connected between the second or first bit line and one end of the second cell block,
   wherein the twisting of the first and second bit lines is carried out at a block selector region in which the first and second block select transistors are disposed.

2. The semiconductor memory according to claim 1, wherein the first and second cell blocks each are composed of a plurality of cell units connected in series, and said plurality of cell units each are composed of a MOS transistor and a ferroelectric capacitor connected in parallel.

3. The semiconductor memory according to claim 1, wherein the twisting of the first and second bit lines is carried out by using wiring in a second wiring layer different from a first wiring layer in which the first and second bit lines are disposed.

4. The semiconductor memory according to claim 3, wherein the second wiring layer is a wiring layer in which block select lines connected to the first and second block select transistors are disposed.

5. The semiconductor memory according to claim 1, wherein the first cell block is connected to the first bit line, and the second cell block is connected to the second bit line.

6. The semiconductor memory according to claim 1, wherein the first cell block is connected to the second bit line, and the second cell block is connected to the first bit line.

7. The semiconductor memory according to claim 1, wherein at least one bit line contact portion is disposed in the constant period.

8. A semiconductor memory comprising:
   first and second bit lines having a twisted bit-line architecture in which the first and second bit lines are alternately twisted at a constant period in first and second columns;
   a first cell block which is disposed in the first column;

a first block select transistor which is connected between the first or second bit line and one end of the first cell block;

a first plate line which is connected to the other end of the first cell block;

a second cell block which is disposed in the second column;

a second block select transistor which is connected between the second or first bit line and one end of the second cell block; and a second plate line which is connected to the other end of the second cell block, wherein the twisting of the first and second bit lines is carried out at a plate line region in which the first and second plate lines are disposed.

9. The semiconductor memory according to claim 8, wherein the first and second cell blocks each are composed of a plurality of cell units connected in series, and said plurality of cell units each are composed of a MOS transistor and a ferroelectric capacitor connected in parallel.

10. The semiconductor memory according to claim 8, wherein the twisting of the first and second bit lines is carried out by using wiring in a second wiring layer different from a first wiring layer in which the first and second bit lines are disposed.

11. The semiconductor memory according to claim 10, wherein the second wiring layer is a wiring layer in which block select lines connected to the first and second block select transistors are disposed.

12. The semiconductor memory according to claim 8, wherein the first cell block is connected to the first bit line, and the second cell block is connected to the second bit line.

13. The semiconductor memory according to claim 8, wherein the first cell block is connected to the second bit line, and the second cell block is connected to the first bit line.

14. The semiconductor memory according to claim 8, wherein at least one bit line contact portion is disposed in the constant period.

15. A semiconductor memory comprising:

first and second bit lines having a twisted bit-line architecture in which the first and second bit lines are alternately twisted at a constant period in first and second columns;

a plurality of first memory cells which are disposed in the first column; and a plurality of second memory cells which are disposed in the second column, wherein the first bit line is only connected to said plurality of first memory cells, and the second bit line is only connected to said plurality of second memory cells.

16. The semiconductor memory according to claim 15, wherein, when the first bit line is disposed in the second column, the first bit line is connected to said plurality of first memory cells by using wiring in a second wiring layer different from a first wiring layer in which the first and second bit lines are disposed, and when the second bit line is disposed in the first column, the second bit line is connected to said plurality of second memory cells by using wiring in the second wiring layer.

17. The semiconductor memory according to claim 15, further comprising:

a first block select transistor which is connected between the first bit line and one end of the first memory cell;

a second block select transistor which is connected between the second bit line and one end of the second memory cell;

a first plate line which is connected to the other end of the first memory cell; and a second plate line which is connected to the other end of the second memory cell.

18. The semiconductor memory according to claim 17, wherein the twisting of the first and second bit lines is carried out at a block selector region in which the first and second block select transistors are disposed, or a plate line region in which the first and second plate lines are disposed.

19. The semiconductor memory according to claim 17, wherein the first and second memory cells each are composed of a MOS transistor and a ferroelectric capacitor connected in parallel.

20. The semiconductor memory according to claim 15, wherein at least one bit line contact portion is disposed in the constant period.

* * * * *